United States Patent
Schossmann et al.

(10) Patent No.: US 8,282,755 B2
(45) Date of Patent: Oct. 9, 2012

(54) CERAMIC MATERIAL, METHOD FOR PRODUCING THE SAME, AND ELECTRO-CERAMIC COMPONENT COMPRISING THE CERAMIC MATERIAL

(75) Inventors: Michael Schossmann, Frauental (AT); Georg Kuegerl, Eibiswald (AT); Alexander Glazunov, Deutschlandsberg (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 13/175,559

(22) Filed: Jul. 1, 2011

(65) Prior Publication Data

US 2011/0259502 A1 Oct. 27, 2011

Related U.S. Application Data

(60) Division of application No. 12/716,704, filed on Mar. 3, 2010, now Pat. No. 7,990,029, which is a continuation of application No. PCT/EP2008/061810, filed on Sep. 5, 2008.

(30) Foreign Application Priority Data

Sep. 7, 2007 (DE) .......... 10 2007 042 572
Sep. 21, 2007 (DE) .......... 10 2007 045 089

(51) Int. Cl.
| | | |
|---|---|---|
| B29C 65/00 | (2006.01) | |
| C03B 29/00 | (2006.01) | |
| B27N 3/00 | (2006.01) | |
| H01G 7/00 | (2006.01) | |
| C04B 35/00 | (2006.01) | |
| C04B 35/03 | (2006.01) | |
| C04B 35/495 | (2006.01) | |
| C03C 10/00 | (2006.01) | |

(52) U.S. Cl. ......... 156/89.12; 156/89.11; 156/62.8; 156/60; 216/6; 501/1; 501/2; 501/94; 501/134; 252/62.9 R

(58) Field of Classification Search ......... 156/89.11, 156/89.12, 62.8, 60; 216/6; 501/1, 2, 94, 501/134; 252/62.9 R
See application file for complete search history.

(56) References Cited

U.S. PATENT DOCUMENTS

| | | | | |
|---|---|---|---|---|
| 5,082,811 | A | | 1/1992 | Bruno |
| 5,500,142 | A | * | 3/1996 | Ushida et al. ......... 252/62.9 R |
| 5,814,923 | A | * | 9/1998 | Shimada ......... 310/311 |
| 6,230,378 | B1 | | 5/2001 | Cramer et al. |
| 6,663,015 | B2 | * | 12/2003 | Yamada et al. ......... 239/102.1 |

(Continued)

FOREIGN PATENT DOCUMENTS

CN 1107823 A 9/1995

(Continued)

OTHER PUBLICATIONS

Jaffe, B., et al., "Piezoelectric Ceramics," Non-Metallic Solids; A Series of Monographs, vol. 3, 1971, 166 pages, London Academic Press.

(Continued)

Primary Examiner — Philip Tucker
Assistant Examiner — Alex Efta
(74) Attorney, Agent, or Firm — Slater & Matsil, L.L.P.

(57) ABSTRACT

A method for producing a ceramic material is disclosed. A ceramic raw material mixture is produced by comminuting and mixing starting materials containing Pb, Zr, Ti, Nd and oxygen. Nickel or an nickel compound is introduced. The raw material mixture is calcined and a ceramic is sintered.

20 Claims, 1 Drawing Sheet

U.S. PATENT DOCUMENTS

| | | | |
|---|---|---|---|
| 7,056,443 B2 * | 6/2006 | Sasaki et al. | 216/18 |
| 7,605,522 B2 * | 10/2009 | Yamamoto et al. | 310/358 |
| 2004/0222719 A1 | 11/2004 | Sasaki et al. | |
| 2006/0279178 A1 | 12/2006 | Ren | |
| 2008/0245991 A1 | 10/2008 | Bamiere et al. | |

FOREIGN PATENT DOCUMENTS

| | | |
|---|---|---|
| CN | 1477687 A | 2/2004 |
| DD | 298 497 A5 | 2/1992 |
| DE | 10 2005 014 765 A1 | 10/2006 |
| EP | 1 628 351 A1 | 2/2006 |
| RU | 2 169 964 C2 | 6/2001 |
| WO | WO 2006/103143 A1 | 10/2006 |
| WO | WO 2006129434 A1 * | 12/2006 |
| WO | Wo 2007/074095 A1 | 7/2007 |

OTHER PUBLICATIONS

Ceramic Material, Method for Producing the Same, and Electro-Ceramic Component Comprising the Ceramic Material, Patent Application No. 200820705957.5, EPCOS AG, Apr. 6, 2012, 9 pages.

Questions, Arguments, Objections, Proposals, Application No. 2010113345/03, Apr. 6, 2010, 3 pages.

* cited by examiner

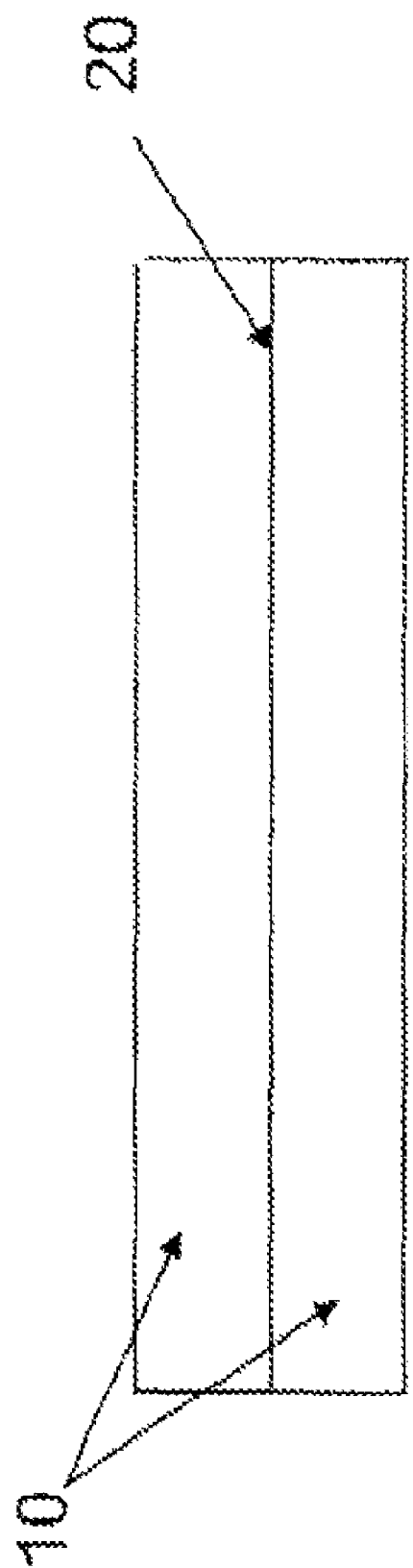

CERAMIC MATERIAL, METHOD FOR PRODUCING THE SAME, AND ELECTRO-CERAMIC COMPONENT COMPRISING THE CERAMIC MATERIAL

This is a divisional of U.S. patent application Ser. No. 12/716,704 now U.S. Pat. No. 7,990,020, filed Mar. 3, 2010, which is a continuation of co-pending International Application No. PCT/EP2008/061810, filed Sep. 5, 2008, which designated the United States and was not published in English, and which claims priority to German Application Nos. 10 2007 042 572.6 filed Sep. 7, 2007 and 10 2007 045 089.5, filed Sep. 21, 2007, each of which is incorporated herein by reference in its entirety.

TECHNICAL FIELD

A ceramic material including lead zirconate titanate is provided, which additionally contains Nd and Ni.

BACKGROUND

Widespread problems of ceramic materials are adaptations of the morphotropic phase boundary, insufficient grain growth or insufficient grain size and high sintering temperatures.

SUMMARY

Embodiments of the invention provide a ceramic material which has an adapted morphotropic phase boundary, and which also has a sufficient grain size and can be sintered at lower temperatures than conventional PZT ceramics.

Advantages can be achieved by adding Ni and Nd to a ceramic material including lead zirconate titanate.

BRIEF DESCRIPTION OF THE DRAWING

The lone FIGURE illustrates a piezoelectric actuator.

DETAILED DESCRIPTION OF ILLUSTRATIVE EMBODIMENTS

By adding Ni and Nd to the lead zirconate titanate, the grain size of the ceramic can be controlled during production. The grain size has a direct relationship with the piezoelectric properties of the ceramic.

The ceramic can furthermore be produced at lower temperatures, which means that it can already be combined with other materials, which are not stable at higher temperatures, during the production method of the ceramic material.

The morphotropic phase boundary of the ceramic can be adapted by suitable selection of the zirconate and titanate components in the ceramic, which in turn has a positive effect on the piezoelectric properties of the ceramic.

The mechanical stresses of lead zirconate titanate ceramic (PZT ceramic) are closely linked with the structure, in particular, the average grain size. The dielectric and electromechanical properties of PZT ceramics are essentially determined by the domain size. This in turn has a dependency on the grain size. Domains in ferroelectric ceramics arise owing to the mechanical stress occurring at the ferroelectric transition point. Materials in which there are electrical dipoles, which can have their position changed by external fields, are referred to as ferroelectrics. The number of domains per unit volume increases with a decreasing grain size. Concomitantly with this, the size of the domains decreases. This decrease in the domain size has effects on the elastic stress fields. The modified domain size has consequences for the material properties of the ceramic. It is therefore desirable to be able to control the grain size, or the grain growth.

According to another embodiment of the invention, the lead zirconate titanate has a perovskite lattice which can be described by the general formula $ABO_3$, where A stands for the A sites and B stands for the B sites of the perovskite lattice.

The perovskite lattice is distinguished by a high tolerance in relation to doping and vacancies.

The perovskite structure of lead zirconate titanate (PZT) can be described by the general formula $ABO_3$. An elementary cell of the PZT crystal lattice can be described by a cube. The A sites are occupied by $Pb^{2+}$ ions, which lie at the corners of the cube. In the middle of each cube surface there is an $O^{2-}$ ion. At the center of the cube there is a $Ti^{4+}$ ion or $Zr^{4+}$ ion. This structure has a high tolerance in relation to substitution of other metal ions by the metal ions and defects, for which reason it can be readily doped.

Depending on the size difference between the ion introduced by doping and the replaced ion, distortion of the highly symmetrical coordination polyhedron may occur.

According to another embodiment of the invention, the ceramic material can be described by the following general formulae:

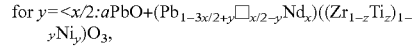

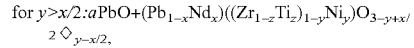

where $0 \leq a < 1$, $0 < x < 1$, $0 < y < 1$, $0 < z < 1$, a stands for an excess of PbO in the weigh-in, □ represents a Pb vacancy and ◊ represents an O vacancy.

Here, distinction is made between two cases as a function of the ratio of Ni to Nd. In the first case, for $y = <x/2$, a Pb vacancy is respectively formed for two Nd atoms which occupy an A site in the perovskite structure, since the two Nd ions compensate for the charge of three Pb ions with two positive charges owing to their triple positive charge.

Each Ni atom, which in this first case occupies a B site, compensates owing to its only double positive charge in comparison with a quadruple positive charge of a replaced Zr or Ti ion in turn to form a Pb vacancy instead of an O vacancy, which is always possible in this case owing to the ratio of Nd to Ni, so that no formation of oxygen vacancies takes place.

In the second case, for which $y > x/2$, in order to conserve charge an O vacancy is formed for each Ni atom which occupies a B site. Since the Ni ion has only two positive charges, but it replaces either Ti or Zr which have four positive charges, an oxygen vacancy is formed in order to conserve charge. The formation of an oxygen vacancy is equivalent to the two "negative charges" which have resulted from the acceptor doping. Owing to the ratio of Nd to Ni, no formation of Pb vacancies takes place since all Pb vacancies are compensated for by oxygen vacancies.

The various possibilities of the doping can be classified with the aid of the valency of the doping ion. Isovalent doping, i.e., the replacement of one ion by another ion with the same valency, does not affect possible vacancies in the ceramic material. If low-valency cations (acceptors) replace cations with a higher valency, then vacancies will be generated in the anion lattice. Higher-valency cations (donors) cause vacancies in the cation lattice when they replace lower-valency cations. Doping with acceptors and donors respectively leads to the characteristic changes in the material properties. Acceptor-doped ceramics are also referred to as "hard" ceramics, and donor-doped ceramics as "soft" ceramics.

In one exemplary embodiment of the invention, Nd occupies A sites in the perovskite lattice.

Doping with $Nd^{3+}$ on the A sites represents donor doping. Owing to the ionic radius of neodymium, it is incorporated onto the $Pb^{2+}$ sites. The charge equilibration takes place by corresponding formation of Pb vacancies. The doping leads to metric changes of the lattice and influences longer-acting interactions between the elementary cells.

In another exemplary embodiment, Ni occupies B sites in the perovskite lattice.

This represents B-site acceptor doping, by means of which inter alia the grain size growth can be controlled.

The doping affects the grain growth of the material, which depends on the concentration of the doping introduced. Small doping amounts contribute to the grain growth, while excessive amounts of doping ions can inhibit the grain growth. The piezoelectric qualities of PZT ceramics are degraded by a reduction of the grain size. The remanent polarization, i.e., the component of the polarization which remains when the electric field is switched off, decreases and concomitantly the piezoelectric properties and the coupling factor are degraded.

In another embodiment of the ceramic material, the following ranges apply for the indices: $0=<a=<0.05$, $0.0001=<x=<0.06$, $0.0001=<y=<0.06$ and $0.35=<z=<0.6$.

The grains of the ceramic material have a good size within these parameter ranges. The morphotropic phase boundary is adapted by means of the parameter z.

In another embodiment of the ceramic material, the following ranges apply for the indices: $0=<a=<0.05$, $0.005=<x=<0.03$, $0.005=<y=<0.03$ and $0.35=<z=<0.6$.

The grains of the ceramic have a very good size in this ceramic. The morphotropic phase boundary is adapted by means of the parameter z.

The Pb vacancies □ formed owing to the charge equilibration in the case of $y=<x/2$ lead to a reduction of the lattice distortion. The modified stability conditions lead to a shift of the morphotropic phase boundary (MPB). The region of the phase diagram in which two regions of different phase geometry meet or coexist, for example, tetragonal or rhombohedral, is referred to as the morphotropic phase boundary. In the tetragonal phase, the cube is distorted along an axis which extends through two opposite oxygen atoms, and in the rhombohedral phase the axis lies on the space diagonals of the cube.

The shift is commensurately greater when the concentration of the doping is higher. The morphotropic phase boundary for PZT with 2 mol % Nd doping lies at a Zr—Ti molar ratio of from 54/46 to 56/44, while in undoped PZT ceramics the morphotropic phase boundary lies at an almost balanced Zr—Ti molar ratio. The shift of the MPG necessitates re-adaptation of the phase boundary, if the ceramic is intended to have good piezoelectric properties.

The properties of donor-doped PZT materials, as exist in this case where Nd occupies Pb sites, are essentially based on an increased domain mobility which is due to the Pb vacancies, as exist in the case of $y=<x/2$. The effect of the vacancies is that the domains can even be influenced by small electric fields. The term domain is intended to mean regions with equal polarization in the ceramic. In comparison with undoped PZT ceramics, this leads to easier displaceability of the domain boundaries and therefore to higher dielectric constants and piezoelectric constants, and higher coupling factors.

The effect of the combination of acceptor and donor doping provided in the exemplary embodiment is to compensate for the negative properties, which occur when the ceramic has been doped with only one of the two doping types. If only acceptor doping is provided, for example, this often leads to decreasing dielectric and piezoelectric constants and a decreasing coupling factor, i.e., the constants are less than those of the undoped ceramic. If only donor doping is provided, then the grain growth is inhibited and the grains of the ceramic do not reach the desired size. However, the combination of the dopings as provided in the exemplary embodiments differs positively from the undoped ceramic in these regards. It has both, better piezoelectric constants and better grain growth, which is furthermore achieved at lower temperatures than in the case of undoped PZT ceramics.

In small-grained materials, the domain boundaries are often located on the grain boundaries and thus cannot contribute to the piezoelectric properties because they are fixed on these grain boundaries. The internal stress can affect the structure of the crystal lattice and the stability of phases. It is therefore desirable to be able to control the grain growth deliberately. This is intended to be done inter alia by means of doping the PZT ceramic.

Embodiments of the invention may be produced for use as sensors or actuators in various geometries. For technological reasons, particular features occur in the structure during production, for example, different grain sizes or different phase boundaries. Since these parameters affect the properties of a ferroelectric material, however, it is desirable to adapt these parameters accordingly to the composition. For the morphotropic phase boundary (MPB), the coexistence of rhombohedral besides tetragonal phases is of interest. This in turn also has a direct relationship with the grain size. In one inventive embodiment of the ceramic, adaptation of the phase boundary is possible by means of the index z, via which the Ti—Zr ratio can be controlled.

Measurements of the piezoelectric properties show that below a limit grain size of about 1 μm, the grain size has a strong effect on the structure. With a decreasing grain size, for instance, the MPB is shifted toward titanium-richer compositions. Internal stresses must be assumed as the cause of this shift. Increased pinning can be observed with a decreasing grain size. This pinning is in turn the cause of internal stresses which influence the piezoelectric properties of the material. The pinning is attributable to the distortion of the crystal lattice in the region on the domain walls. The nanometer-range domains formed in the case of small grains are almost fully locked. This locking leads to a deformation of the elementary cells and to destabilization of the tetragonal structure, which in turn leads to the shift of the MPB. For this reason, it is desirable to be able to influence the grain size by means of appropriately doping the PZT ceramic.

For technical use of such fine-grained ceramics, the shift of the phase boundary must be taken into account. This makes it necessary to adapt the MPB. Such adaptation may be carried out by means of doping the lead zirconate titanate component of the ceramic material. Such doping also has an effect on the sintering properties as well as the grain growth. If the doping is carried out only with Nd, this acts as a growth inhibitor with respect to the grain sizes so that ceramics with a sufficiently good structure can only be achieved with elevated sintering temperatures. These high temperatures, however, have significant disadvantages: the process times are lengthened, precipitation may occur and the inner electrodes of electro-ceramic components including these ceramic materials must be manufactured from expensive noble metals. It is thus desirable to keep the sintering temperature as low as possible. Doping with Nd and Ni makes it possible to reach desired grain sizes despite lower temperatures.

Owing to the aforementioned properties, the ceramic is very suitable for fabrication and use in electro-ceramic components.

Reducing the sintering temperature also offers the possibility of combinations with other materials, which would not be possible with the higher sintering temperatures that have been needed with PZT ceramics not according to the invention. For example, with metals such as copper, the melting point of which is 1083° C. This opens up new opportunities, for example in the field of piezoelectric actuators.

Reducing the sintering temperature by adding Ni offers the possibility of producing piezoelectric actuators from the ceramic including Nd and Ni with inner electrodes which contain either only a small proportion of rare earth metal (for example, Pd) or none at all. Particular embodiments of the ceramic according to the invention are therefore also suitable for actuators with inner electrodes having a low melting point. For example, for the case in which the inner electrodes include a material which is selected from: Cu, Pd, Ag or an alloy of these metals.

One embodiment of the invention is a piezoelectric actuator. A preferred embodiment, which is shown in the FIGURE, includes at least two layers 10 of the PZT ceramic material doped with Ni and Nd, between which there is an inner electrode 20. This inner electrode could, for example, be made from Cu, Pd, Ni, Ag or an alloy of these metals.

Incorporating Ni into the PZT lattice can reduce or even prevent reaction between the piezoelectric ceramic and the metal of the inner electrode, which takes place during the process of sintering at high temperatures. Taking, for example, an actuator which has a Cu inner electrode and is made of a ceramic material that has not been doped with Ni, according to the formula

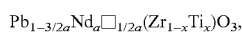

$$Pb_{1-3/2a}Nd_a\square_{1/2a}(Zr_{1-x}Ti_x)O_3,$$

where $0<a<1$, $0<x<1$ and $\square$ represents a Pb vacancy, the crystal lattice contains ½ a Pb vacancy owing to the different oxidation states of Pb and Nd, namely 2+ compared with 3+. These vacancies allow diffusion of the Cu ions from the inner electrodes into the ceramic, where the Cu ions become incorporated into the crystal lattice. This problem is reduced or resolved in one embodiment of the invention by incorporating Ni on B sites of the crystal lattice. The resulting compensation for the Pb vacancies $\square$ on the A sites decreases the tendency of copper to diffuse from the inner electrodes into the ceramic, which reduces or even entirely prevents migration of the Cu ions.

Entirely or partially prevented diffusion of the Cu ions has various advantages for the electro-ceramic components manufactured from the ceramics according to the invention. First, in this case the inner electrodes do not shed any material and can form a continuous layer, which ensures better conductivity of the inner electrodes.

Secondly, preventing reactions between the inner electrode metal and the ceramic leads to a reduction of the wetting force between the inner electrode and the ceramic. Weaker wetting ensures that cracks which occur in the base body of the actuator during poling or operation of the piezoelectric actuator only remain at the boundary between the inner electrode and the ceramic, and do not extend further through the ceramic. This extends the lifetime of the piezoelectric actuator.

The transition region between tetragonal and rhombohedral phases is particularly important in the embodiments of the ceramic. In it, concentration-dependent transformation between two crystal structures in the ceramic material takes place. According to Jaffe, such a phase boundary is referred to as "morphotropic." The material properties exhibit some particular features in this region, which are of particular interest for technical application. The ceramics exhibit particularly good piezoelectric properties at phase transitions. Some material constants which crucially influence the piezoelectric behavior of the PZT ceramic exhibit good values, for example, pronounced maxima, at the morphotropic phase boundary, for example, the dielectric constant $\in_r$, the piezoelectric charge constant $d_{33}$ and the coupling factor k.

The relative dielectric constant $\in_r$ is the ratio between the absolute permittivity of the ceramic material and the permittivity in a vacuum, the absolute permittivity representing a measure of the polarizability in an electric field. The efficacy of the piezo effect is characterized by the piezoelectric charge constant $d_{ij}$, which represents the ratio of the generated charge density to the mechanical deformation. The direction dependency of the parameter is specified by the corresponding indices. The index i of the piezoelectric charge constant indicates the direction of the electric field, and the index j indicates the direction of the deformation by which the crystal reacts to the field. Here, 1 stands for the x direction, 2 for the y direction and 3 for the z direction. The piezoelectric charge constant $d_{33}$ therefore denotes the longitudinal extension behavior in the direction of the z axis. The coupling factor k is a measure of the degree of the piezoelectric effect. It describes the ability of a piezoelectric material to convert absorbed electrical energy into mechanical energy, and vice versa. Here, $k_{33}$ stands for the coupling factor of the longitudinal oscillation. For the longitudinal effect, the polar axis of the crystal is collinear with the deformation direction.

If the piezoelectric charge constant $d_{33}$ of the only Nd-doped ceramic 0.015 $PbO+(Pb_{0.97}\square_{0.01}Nd_{0.02})(Zr_{0.5515}Ti_{0.4485})O_3$ ($d_{33}$: 690 pm/V) is compared with the corresponding exemplary embodiment of a ceramic according to the invention which additionally includes Ni, 0.015 $PbO+(Pb_{0.975}\square_{0.005}Nd_{0.02})((Zr_{0.5515}Ti_{0.4485})_{0.995}Ni_{0.005})O_3$ ($d_{33}$: 740 pm/V), a significant increase in the value can be seen, which means greater extension for the same applied voltage. The improved piezoelectric properties therefore increase the efficiency of the corresponding exemplary embodiments, in which this ceramic is used.

The coexistence of the rhombohedral and tetragonal phases is taken as the cause of the maxima in the physical properties at the MPB. This coexistence favors the alignment of domains in the electric field and thus improves the polarizability of the ceramic. This further underlines the importance and special status of the MPB in the PZT ceramic.

Owing to their good piezoelectric properties, embodiments of the ceramic material according to the invention are suitable for use in, for example, multilayer components.

If a plurality of ceramic layers and inner electrodes are arranged alternately above one another, then a multilayer piezoelectric component is obtained. In this context, the term alternately is intended to mean that a particular number of ceramic layers is always followed by an inner electrode.

A production method for the ceramic material is also the subject-matter of other embodiments of the invention.

The method for producing the ceramic material includes the following steps:

A1) producing a ceramic raw material mixture by comminuting and mixing starting materials containing Pb, Zr, Ti, Nd and oxygen;

B1) introducing Ni or an Ni compound;

C1) calcining the raw material mixture; and

D1) sintering the ceramic.

Here, the starting materials may be provided as oxides. The starting materials may however also be provided in the form of, for example, metal carbonates, metal hydrogen carbonates or metalorganic compounds.

The elements Zr and Ti may also be used in the form of a precursor such as $(Zr,Ti)O_2$ as a starting material.

The elements Pb, Zr, Ti and Nd in their corresponding starting compounds are mixed according to the stoichiometric ratios of the elements in the ceramic material to be produced.

Nd is added in a range of from 0.01 to 6 mol %, the range of from 0.5 to 3 mol % being preferred.

Ni or Ni compounds may be introduced either before calcining or not until after it.

Ni is added in a range of from 0.01 to 6 mol %, the range of from 0.5 to 3 mol % being preferred. In this case, Ni or the Ni compound is likewise added according to the stoichiometric ratio of Ni in relation to the other elements in the ceramic material to be produced.

The ceramic raw material mixture is calcined in method step C1) at a temperature which lies between 850 and 970° C. This allows the ceramic to form mixed crystal phases.

The ceramic, referred to as "raw" or "green," is sintered in method step D1). Here, the sintering temperature lies, for example, between 950 and 1070° C. It is therefore lower than the melting point of copper (1083° C.), which allows the inner electrodes of a piezoelectric actuator to be made, for example, entirely of copper, or of alloys whose melting point lies in the copper range.

For shaping, the mixed crystal phase resulting from the calcining may be ground again in an additional intermediate method step and converted into a ceramic mass by adding a binder. This can then be put into the desired shape, for example, green sheets. Since the binder is not desired in the end product, it should be thermally or hydrothermally degradable. For example, binders based on polyurethane are suitable for this. However, the binder ought to be removed in an additional thermal process before sintering. Debindering is intended to prevent undesired, e.g., organic substances from being burnt in.

A production method for a multilayer component, which includes the ceramic according to the invention, is furthermore claimed.

The method for producing the multilayer component includes the following method steps:

A2) providing ceramic green sheets which are produced according to one of the methods described above;
B2) layering the ceramic green sheets on one another to form a stack;
C2) consolidating the stack by lamination, so as to create green parts;
D2) debindering the green parts; and
E2) sintering the green parts.

The ceramic green sheets already contain starting materials containing Pb, Zr, Ti, Nd, oxygen and Ni. The Ni may have been added to the original mixture of starting materials either before or after calcining.

The lamination in method step C2) may, for example, be carried out with a pressing force of from 100 to 130 tonnes. The pressing force may be adapted to the type of binder.

The debindering in method step D2) may be carried out under an inert atmosphere at 550° C., which would, for example, be preferred conditions for copper inner electrodes. The debindering may, however, also be carried out under an air atmosphere. Here, for example, the temperature is adapted to the binder material and the material of the inner electrodes.

The sintering in method step E2) may, for example, be carried out for 4 hours at a temperature of up to 1070° C. One possible sintering temperature range covers from 960 to 1100° C., although higher temperatures may also be successful. However, the range of from 980 to 1040° C. is preferred.

For the sintering in method step E2), a gas mixture which includes nitrogen, hydrogen and steam may be used.

If the multilayer component includes inner electrodes, then the material for the inner electrodes may be applied onto the green sheets, for example, by printing, between method steps A2) and B2).

Another production method for a multilayer component is furthermore claimed, during the production of which another embodiment of the ceramic is formed.

This further production method includes the following method steps:

A3) producing a ceramic raw material mixture by comminuting and mixing starting materials containing Pb, Zr, Ti, Nd and oxygen;
B3) calcining the ceramic raw material mixture;
C3) adding a binder to the ceramic raw material mixture of B3);
D3) forming green sheets from the mixture of C3);
E3) printing inner electrodes on the green sheets of D3), the material of the inner electrodes comprising Ni;
F3) layering the ceramic green sheets of E3) on one another to form a stack;
G3) consolidating the stack by lamination, so as to create green parts;
H3) debindering the green parts; and
I3) sintering the green parts, some of the Ni being transferred from the inner electrodes into the ceramic material and being incorporated in it.

Here, green sheets according to D3), i.e., green sheets on which electrode material has not been printed, may be layered between the green sheets of E3) in method step F3).

Method step C3) may include a polyurethane binder, which may be thermally or hydrothermally degradable.

The material of the inner electrodes may include metallic Ni or Ni oxide. By printing on the green sheets in method step E3), the Ni ions already have the opportunity to diffuse into the ceramic material.

The lamination in method step G3) may be carried out with a pressing force of from 100 to 130 tonnes. The pressure leads to the formation of green parts.

The debindering in method step H3) may be carried out under an inert atmosphere or air atmosphere at 550° C. In this method step, the temperature must be selected so that the undesired, often organic constituents, which have been introduced inter alia by the binder, are burnt out. The debindering temperature is therefore preferably adapted to the type of binder. However, the material of the inner electrodes also plays a role in the selection of the debindering temperature. The heat treatment can also contribute to the diffusion of Ni out of the electrode material into the ceramic.

The sintering in method step I3) may be carried out for 4 hours at a temperature of up to 1070° C. One possible sintering temperature range covers from 960 to 1100° C., the range of from 980 to 1040° C. being preferred, although temperatures of more than 1100° C. may also lead to the desired result.

For the sintering in method step I3), a gas mixture which includes nitrogen, hydrogen and steam may be used. During the sintering process, Ni ions migrate out of the inner electrode material into the ceramic where they are then incorporated on B sites.

The multilayer component may be ground and polished in further steps. Contacting, for example, with a copper paste, may be carried out in the region where the inner electrodes emerge. After the paste has been burnt in, the multilayer component may then be provided with wires by means of the conventional bonding technology. This results in a piezoelectric actuator.

The invention is not restricted by the description with reference to exemplary embodiments. Rather, the invention includes any new feature and any combination of features, which includes, in particular, any combination of features in the patent claims, even if this feature or this combination per se is not explicitly referred to in the patent claims or exemplary embodiments.

What is claimed is:

1. A method for producing a ceramic material, the method comprising:
producing a ceramic raw material mixture by comminuting and mixing starting materials containing Pb, Zr, Ti, Nd and oxygen,
introducing Ni or an Ni compound,
calcining the raw material mixture, and
sintering a ceramic, wherein the ceramic has a composition according to the following formula:

$$a\text{PbO} + (\text{Pb}_{1-3x/2+y}\square_{x/2-y}\text{Nd}_x)((\text{Zr}_{1-z}\text{Ti}_z)_{1-y}\text{Ni}_y)\text{O}_3$$

where $0 \leq a < 1$, $0 < x < 1$, $0 < y < 1$, $0 < z < 1$, $y \leq x/2$, a stands for an excess of PbO in the weigh-in, and $\square$ represents a Pb vacancy.

2. The method as claimed in claim 1, wherein Nd is introduced in a range of from 0.01 to 6 mol %.

3. The method as claimed in claim 1, wherein introducing Ni or a Ni compound is carried out before the calcining.

4. The method as claimed in claim 1, wherein introducing Ni or a Ni compound is carried out after the calcining.

5. The method as claimed in claim 1, wherein Ni is introduced in a range of from 0.01 to 6 mol %.

6. The method as claimed in claim 1, further comprising forming ceramic green sheets from the ceramic raw material mixture comprising a binder, the ceramic green sheets formed before the sintering.

7. The method as claimed in claim 1, wherein $0 \leq a \leq 0.05$, $0.0001 \leq x \leq 0.06$, $0.0001 \leq y \leq 0.06$, and $0.35 \leq z \leq 0.6$.

8. The method as claimed in claim 1, wherein $0 \leq a \leq 0.05$, $0.005 \leq x \leq 0.03$, $0.005 \leq y \leq 0.03$, and $0.35 \leq z \leq 0.6$.

9. A method for producing a ceramic material, the method comprising:
producing a ceramic raw material mixture by comminuting and mixing starting materials containing Pb, Zr, Ti, Nd and oxygen,
introducing Ni or an Ni compound,
calcining the raw material mixture, and
sintering a ceramic, wherein the ceramic has a composition according to the following formula:

$$a\text{PbO} + (\text{Pb}_{1-x}\text{Nd}_x)((\text{Zr}_{1-z}\text{Ti}_z)_{1-y}\text{Ni}_y)\text{O}_{3-y+x/2} \diamond_{y-x/2}$$

where $0 \leq a < 1$, $0 < x < 1$, $0 < y < 1$, $0 < z < 1$, $y > x/2$, a stands for an excess of PbO in the weigh-in, $\diamond$ represents an O vacancy.

10. The method as claimed in claim 9, wherein $0 \leq a \leq 0.05$, $0.0001 \leq x \leq 0.06$, $0.0001 \leq y \leq 0.06$, and $0.35 \leq z \leq 0.6$.

11. A method for producing a multilayer electro-ceramic component, the method comprising:
producing a ceramic raw material mixture by comminuting and mixing starting materials containing Pb, Zr, Ti, Nd and oxygen;
introducing Ni or an Ni compound to the raw material mixture;
calcining the raw material mixture;
forming ceramic green sheets from the ceramic raw material mixture;
layering the ceramic green sheets on one another to form a stack;
consolidating the stack by lamination, so as to create green parts;
debindering the green parts; and
sintering the green parts, wherein the electro-ceramic component comprises a piezoelectric actuator that comprises two layers of ceramic material and an inner electrode between the two layers of ceramic material and wherein the ceramic has a composition according to the following formula:

$$a\text{PbO} + (\text{Pb}_{1-3x/2+y}\square_{x/2-y}\text{Nd}_x)((\text{Zr}_{1-z}\text{Ti}_z)_{1-y}\text{Ni}_y)\text{O}_3$$

where $0 \leq a < 1$, $0 < x < 1$, $0 < y < 1$, $0 < z < 1$, $y < x/2$, a stands for an excess of PbO in the weigh-in, and $\square$ represents a Pb vacancy.

12. A method for producing a multilayer electro-ceramic component, the method comprising:
producing a ceramic raw material. mixture by comminuting and mixing starting materials containing Pb, Zr, Ti, Nd and oxygen;
introducing Ni or an Ni compound to the raw material mixture;
calcining the raw material mixture;
forming ceramic green sheets from the ceramic raw material mixture;
layering the ceramic green sheets on one another to form a stack;
consolidating the stack by lamination, so as to create green parts;
debindering the green parts; and
sintering the green parts, wherein the electro-ceramic component comprises a piezoelectric actuator that comprises two layers of ceramic Material and an inner electrode between the two layers of ceramic material and wherein the ceramic has a composition according to the following formula:

$$a\text{PbO} + (\text{Pb}_{1-x}\text{Nd}_x)((\text{Zr}_{1-z}\text{Ti}_z)_{1-y}\text{Ni}_y)\text{O}_{3-y+x/2} \diamond_{y-x/2}$$

where $0 \leq a < 1$, $0 < x < 1$, $0 < y < 1$, $0 < z < 1$, $y > x/2$, a stands for an excess of PbO in the weigh-in, $\diamond$ represents an O vacancy.

13. A method for producing a multilayer component, the method comprising:
producing a ceramic raw material mixture by comminuting and mixing starting materials containing Pb, Zr, Ti, Nd and oxygen;
calcining the ceramic raw material mixture;
adding a binder to the calcined ceramic raw material mixture;
forming green sheets from the mixture with the binder;
printing inner electrodes on the green sheets, a material of the inner electrodes comprising Ni;
layering the ceramic green sheets on one another to form a stack;
consolidating the stack by lamination, so as to create green parts;
debindering the green parts; and
sintering the green parts, some of the Ni being transferred from the inner electrodes into the ceramic material and being incorporated in the ceramic material, wherein the multilayer component comprises a piezoelectric actuator that comprises two layers of ceramic material and an inner electrode between the two layers ceramic material and wherein the ceramic has a composition according to the following formula:

$$a\text{PbO}+(\text{Pb}_{1-3x/2+y}\square_{x/2-y}\text{Nd}_x)((\text{Zr}_{1-z}\text{Ti}_z)_{1-y}\text{Ni}_y)\text{O}_3$$

where $0 \leq a < 1$, $0 < x < 1$, $0 < y < 1$, $0 < z < 1$, $y \leq x/2$, a stands for an excess of PbO in the weigh-in, $\square$ represents a Pb vacancy.

14. The method as claimed in claim 13, wherein the inner electrodes comprise metallic Ni or Ni oxide.

15. A method for producing a multilayer component, the method comprising:
producing a ceramic raw material mixture by comminuting and mixing starting materials containing Pb, Zr, Ti, Nd and oxygen;
calcining the ceramic raw material mixture;
adding a binder to the calcined ceramic raw material mixture;
forming green sheets from the mixture with the binder;
printing inner electrodes on the green sheets, a material of the inner electrodes comprising Ni;
layering the ceramic green sheets on one another to form a stack;
consolidating the stack by lamination, so as to create green parts;
debindering the green parts; and
sintering the green parts, some of the Ni being transferred from the inner electrodes into the ceramic material and being incorporated in the ceramic material, wherein the ceramic has a composition according to the following formula:

$$a\text{PbO}+(\text{Pb}_{1-x}\text{Nd}_x)((\text{Zr}_{1-z}\text{Ti}_z)_{1-y}\text{Ni}_y)\text{O}_{3-y+x/2}\diamond_{y-x/2},$$

where $0 \leq a < 1$, $0 < x < 1$, $0 < y < 1$, $0 < z < 1$, $y > x/2$, a stands for an excess of PbO in the weigh-in, $\diamond$ represents an O vacancy.

16. The method as claimed in claim 15, wherein the inner electrodes comprise metallic Ni or Ni oxide.

17. The method as claimed in claim 9, wherein Nd or Ni is introduced in a range of from 0.01 to 6 mol %.

18. The method as claimed in claim 9, wherein introducing Ni or a Ni compound is carried out before the calcining.

19. The method as claimed in claim 9, wherein introducing Ni or a Ni compound is carried out after the calcining.

20. The method as claimed in claim 9, further comprising forming ceramic green sheets from the ceramic raw material mixture comprising a binder, the ceramic green sheets formed before the sintering.

* * * * *